United States Patent [19]

Gerber et al.

[11] 4,228,527

[45] Oct. 14, 1980

[54] ELECTRICALLY REPROGRAMMABLE NON VOLATILE MEMORY

[75] Inventors: Bernard Gerber, Neuchâtel; Fritz Leuenberger, Hinterkappelen, both of Switzerland

[73] Assignee: Centre Electronique Horloger S.A., Neuchâtel, Switzerland

[21] Appl. No.: 14,251

[22] Filed: Feb. 22, 1979

[30] Foreign Application Priority Data

Feb. 22, 1978 [CH] Switzerland .......................... 1889/78

[51] Int. Cl.$^3$ ............................................ G11C 11/40
[52] U.S. Cl. ..................................... 365/185; 365/181
[58] Field of Search ......................... 365/181, 185, 188

[56] References Cited

PUBLICATIONS

Gosney, DIFMOS–A Floating-Gate Electrically Erasable Nonvolatile Semiconductor Memory Technology, IEEE Trans. on Electron Devices, vol. ED-24, No. 5, 5/77, pp. 594–599.

Rossler et al., Erasable and Electrically Reprogrammable Read-Only Memory Using the N-Channel SIMOS One-Transistor Cell, Siemens Forschungsund Entwicklungsberichten, vol. 4, No. 6, 1975, pp. 345–362.

Tarvi et al., Electrically Reprogrammable Nonvolatile Semiconductor Memory, IEEE Jour. of Solid-State Circuits, vol. SC-7, No. 5, 10/72, pp. 369–375.

*Primary Examiner*—Stuart N. Hecker
*Attorney, Agent, or Firm*—Cushman, Darby & Cushman

[57] ABSTRACT

An electrically reprogrammable non-volatile memory device is disclosed which includes complementary MOS transistors provided with a polycrystalline silicon floating gate electrode in a common $n^-$-type substrate. The device comprises three main parts. The first part, which is used for writing, comprises a p-channel writing transistor, a p-channel control transistor and a resistance element. The second part, which comprises a second gate electrode capacitance coupled with the floating gate, is used for erasing. The third part is used for performing information read-out and consists of a p-channel transistor the gate of which forms a portion of the floating gate and the drain of which is connected to a read-out terminal and to the terminal of a loading element having its other terminal connected to a negative supply potential. This device enables writing control to be performed using a logical signal of the order of one volt, read-out being also performed with a low voltage value, with low energy consumption. Erasure of information can be performed electrically and the retention time is of several years.

9 Claims, 5 Drawing Figures

ELECTRICALLY REPROGRAMMABLE NON VOLATILE MEMORY

BACKGROUND OF THE INVENTION

1. Field of the Invention

The invention relates to an electrically reprogrammable non-volatile memory device comprising an integrated circuit including complementary MOS transistors provided with a polycrystalline silicon floating gate electrode in a common $n^-$-type grounded substrate.

2. Prior Art

Floating gate structures in which use of a floating gate (such as polycrystalline silicon floating gate electrode) is combined with avalanche electron injection are already known. Such structures have an extremely long memory retention time (several decades) owing to the fact that they are provided with relatively thick oxide layers. One memory device of this kind, which is commercially known under the name of FAMOS (floating-gate avalanche-injection MOS), has been developed by D. Frohman-Bentchkowsky and is described in Applied Physics Letters, pp. 332–334, volume 18, No. 8, published on Apr. 15, 1971. This kind of memory has the drawback that erasure can be performed only by subjecting the device to ultraviolet radiation or to X-rays.

Another device, which has been developed by Tarui et al. and which is described in IEEE Journal of Solid State Circuits, Volume SC-7, No. 5, October 1972, known under the name of two-junction type floating gate, consists of a p-channel transistor in which a $n^+$-p junction has been added in the channel portion. A second gate, made of aluminum, is provided over the floating gate. Writing is effected by injection of electrons by avalanche breakdown of the drain $p^+$-n junction, the second gate being either grounded or connected to a positive potential. Erasure is carried out by avalanche injection of holes which causes neutralization of the electron charge, the substrate being positive biased, the source being grounded and the second gate negative biased. One of the drawbacks of this kind of structure lies in the fact that injection of holes is a low efficiency and slow process. Furthermore, this type of structure is complicated and the substrate must be able to be positively biased.

One improvement of the FAMOS structure has been suggested by H. Iizuka et al. and described in IEEE Transactions on Electron Devices, volume ED-23, No. 4, published April 1976, under the name of SAMOS structure (Stacked-gate avalanche-injection type MOS). This structure is actually a FAMOS structure to which a second gate has been added in order to render it electrically erasable. Erasing is performed by Fowler-Nordheim effect between the first and second polycrystalline silicon gate by applying a high positive potential to the second gate which is called the control gate. In practice, it is difficult, in that kind of structure, to control the height of the potential barrier between the first and the second gate and one observes, during application of the charge and depending on the values of the voltages applied on the drain and on the second gate, that competition takes place between Fowler-Nordheim effect across the second gate and avalanche across the first gate.

Another structure, which has been developed by Jan F. Verwey et al. and is described in IEEE Transactions on Electron Devices, volume ED-21, No. 10, published October 1974 and known as ATMOS structure (Adjustable threshold MOS) comprises a n-channel transistor provided with a floating gate realized on an epitaxial p layer grown on a $n^+$-type substrate. This structure which has an excellent retention time and uses moderate voltage for the writing and erasing operations has the following drawbacks: necessity of using an epitaxial layer, relatively slow writing and erasing processes.

A structure called SIMOS, which has been developed by B. Roessler and R. G. Mueller, is described in the publication "Erasable and Electrically Reprogrammable Read-Only Memory using the N-Channel SIMOS One Transistor Cell" in Siemens Forschungs- und Entwicklungsberichten, Volume 4, No. 6, pp. 345-362, published in 1975 and, more recently in IEEE Transactions on Electron Devices, volume ED-24, No. 5 (May 1977) under the titles "Technology of a New n-Channel One-Transistor EAROM Cell Called SIMOS", by A. Scheibe and H. Schulte (p. 600), and "Electrically Erasable and Reprogrammable Read-Only Memory Using the n-Channel SIMOS One-Transistor Cell" by B. Roessler (p. 606). This memory is of the n-channel type with a double self-aligned polycrystalline silicon gate and it has the disadvantage of necessitating channel length of 3 to 4 $\mu$m which is rather difficult to control. Writing operation is achieved by injection of electrons from the channel portion without pinchoff whereas erasure is performed by Fowler-Nordheim effect, a positive voltage ramp being applied on the MOST source which is partially overlaid with a thinner oxide layer of 500 Å which is itself covered by the floating gate. Erasure time is of the order of one minute.

Finally, another structure, called DIFMOS, which has been developed by Texas Instruments Co., is described in an article bearing the title "La REPROM ultra-simple existe" (ultra-simple REPROM does exist), which was published in the revue Inter Electronique, volume 20, pages 16 to 22, in 1976 and more recently in IEEE Transactions on Electron Devices, volume ED-24, No. 5 (May 1977), page 594 by M. Gosney. This memory structure uses an aluminum floating gate. The write operation is performed by injection of electrons by avalanche of a $p^+$-n diode and the erase operation is carried out by hole-injection using a $n^+$-p junction while simultanously applying a negative voltage on a capacitor which drives the floating gate. The drawbacks of such a structure are the relatively high values of the writing and erasing currents ($\sim 0.5$ m A), slow programming times and the fact that simultaneous application of two voltages is required for erasure. The cell has relatively large dimensions.

Generally, read-out of the above-described structures cannot be performed using such low voltages of the order of one volt. Adressing also requires higher voltages and realization of the corresponding structures often requires a special technology.

SUMMARY OF THE INVENTION

An object of the invention is to remedy the above-indicated drawbacks while retaining a very long memory retention time and to provide a memory device presenting simultaneously the following features: comptability with a CMOS polycrystalline silicon gate technology; possibility of addressing using a low voltage logical signal of the order of one volt; memory read-out at low voltages; low energy consumption;

electrical erasure; information retention time of several years.

In order to satisfy those requirements, the memory device according to the invention includes three parts, of which the first part is used for writing information and for addressing, the second part being utilized to perform erasure; and the third part being utilized to perform read-out of the information; said floating gate electrode forming a common electrode to said three parts of the device; said first part comprising a p-channel writing transistor, having its drain, which provides a $p^+$-n junction for injection of electrons, connected, on the one hand, to the drain of a p-channel control transistor the source of which is grounded, and, on the other hand, to a resistance element which is connected to a terminal delivering a high negative voltage during the writing operation; said second part of the circuit comprising a second gate electrode which is capacitively coupled to said floating gate electrode in such a manner that the electric field between both electrodes is lower than the electric field across the gate oxide layer of the said transistors, and said second gate electrode being connected to a terminal delivering a high negative voltage during the erasure operation; and said third part or the circuit consisting of a p-channel read-out transistor, the source of which is grounded, its gate forming a portion of the floating gate electrode and its drain being connected to a read-out terminal and to a terminal of a loading element, which is for instance a n-channel transistor, having its other terminal connected to a negative supply voltage.

The operation principle of this memory device is based on the following processes:

Information writing is performed by injection of electrons by avalanche breakdown of the injection junction which requires applying a moderate external negative voltage (e.g. 40 V) and currents of some tens of microamperes. The avalanche may be suppressed by rendering the control transistor conductive using a logical signal which is internal to the circuit and has a low voltage value (e.g. of the order of 1.5 V) which renders the write operation selective.

Erasure is achieved by electron extraction by Fowler-Nordheim effect across the gate oxide layer wherein relatively high negative voltages (e.g. of the order of 60 to 70 V) are capacitively transmitted to the floating gate using very weak average current values, for instance of the order of one nanoampere.

Memory read-out, which is permanent and without energy consumption, is achieved by the read-out terminal which is grounded when the memory is in the written state (the p-channel MOST of the inverter being conductive) or connected to the supply voltage of the circuit when the memory is in the erased state (the n-channel MOST of the inverter being conductive).

DETAILED DESCRIPTION OF THE INVENTION

Figure 1:
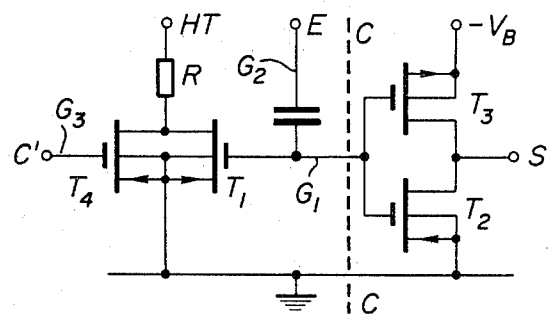
FIG. 1 is a schematic view of the equivalent electrical circuit of an integrated memory device in accordance with the present invention.

The integrated circuit of FIG. 1 comprises a p-channel MOS transistor $T_1$, a p-channel MOS transistor $T_4$, a p-channel MOS transistor $T_2$ and n-channel MOS transistor $T_3$. This circuit further comprises a polycrystalline silicon floating gate $G_1$, which is a common electrode of transistors $T_1$, $T_2$ and $T_3$. The drain of transistor $T_1$ is used as an electron-injection junction for memory writing. Transistor $T_4$ is a control transistor and transistors $T_2$ and $T_3$ are associated with each other in forming an inverter circuit. Control transistor $T_4$ is connected in parallel with transistor $T_1$. The drains of transistors $T_1$ and $T_4$ are connected, across a resistance element R, to a terminal HT which functions as a writing terminal. Gate $G_3$ of transistor $T_4$ is connected to a control terminal $C'$. The association of transistors $T_2$ and $T_3$ to form the inverter circuit is realized by connecting together the drains of these transistors, across a common lead, to a read-out terminal S. The source of the n-channel transistor $T_3$ is connected to a supply terminal $-V_B$ and the sources of transistors $T_1$, $T_2$ and $T_4$ are grounded across a common lead. An electrode $G_2$, acting as a second gate, is connected to a terminal E which functions as an erasing terminal, said electrode $G_2$ being, furthermore, capacitively coupled to the floating gate $G_1$.

The memory device consisting of the integrated circuit of FIG. 1 operates as follows:

Terminal HT being biased with a voltage of about $-40$ V, writing control can be performed by changing the voltage which is applied to the control terminal $C'$. This is because, when the voltage applied to the terminal $C'$ and consequently to the control gate $G_3$ of the control transistor $T_4$, has a value of $-V_B$ (e.g. $-1.5$ V), transistor $T_4$ is in a conductive state and a voltage drop on the resistance element R occurs with a sufficient amplitude to render the voltage value on the drains of transistors $T_4$ and $T_1$ inferior to the avalanche voltage of the drain junction of transistor $T_1$. Under these conditions, no writing occurs. On the other hand, when one blocks the control transistor $T_4$ by grounding the control gate $G_3$, the voltage value on the drains of the transistors $T_4$ and $T_1$ becomes sufficient to cause avalanche of the drain junction of the writing transistor $T_1$ and, consequently, to provoke injection of hot electrons into the floating gate $G_1$. This gate is thus negatively charged and transistor $T_1$ becomes conductive which causes a voltage drop on the resistor R and automatically stops the avalanche. Further, the fact that the floating gate $G_1$ is negatively charged renders the transistor $T_2$ conductive which causes grounding of the output terminal S of the inverter. It must be noted that, in order to minimize power consumption, it is advantageous to eliminate the source of transistor $T_1$ thus eliminating the channel conduction current of this transistor when gate $G_1$ is being negatively charged.

To perform erasure, one applies on the second gate $G_2$ a voltage having a sufficiently negative value with respect to the ground potential to which the substrate and the sources of the p-channel MOST $T_1$, $T_2$ and $T_4$ are connected. The floating gate is capacitively coupled to the gate $G_2$ across an insulating layer and to the substrate across the field oxide layer and also across the gate oxide layer of transistors $T_1$, $T_2$ and $T_3$. The dimensions of this structure are chosen in such a way that the ratio of the capacitance between the floating gate and the second gate to the capacitance between the floating gate and the substrate be such that the electric field in the gate oxide layer of the transistors $T_1$, $T_2$ and $T_4$ is higher than the electric field which occurs in the space between the floating gate and the second gate. By applying on the erasing electrode a voltage with a sufficiently negative value with respect to the substrate, the electrons of the floating gate will be re-injected across the gate oxide layer into the substrate by Fowler-Nordheim effect. The voltage value to be applied on the erasing gate depends on the capacitance ratios which are selected and will be lower in accordance with a higher value of the capacitance between the erasing gate and the floating gate.

From the above description of the operation of the memory device of FIG. 1, it will be seen that the circuit comprises three parts. A first part of the circuit, comprising the transistors $T_1$ and $T_4$, the resistance element R, the control gate $G_3$ and the portion of the floating gate $G_1$ which belongs to the writing transistor $T_1$, is used for performing writing of information. A second part of the circuit, comprising the second gate $G_2$ which is coupled by capacitance with the floating gate is used for achieving erasure of information by re-injection of the negative charges into the substrate across the gate oxide layer of transistors $T_1$, $T_2$ and $T_3$. A third part of the circuit, which comprises the transistors $T_2$ and $T_3$ and the electrical connections which connect, on the one hand the drains of the transistors $T_2$ and $T_3$ to the output terminal S of the inverter and, on the other hand, the source of transistor $T_2$ to the source of transistor $T_4$ (and also, to the source of transistor $T_1$, if any), is used for performing read-out of the information stored in the memory device.

It must be noted that, in contrast to the write operation, erasure of the information is non-selective. After erasure, the n-channel transistor $T_3$ of the inverter is in a conductive state and the output S is at potential $-V_B$. In each of the two states of the memory device (written; erased), one of the two transistors $T_2$ and $T_3$ of the inverter is blocked. The static energy consumption of the inverter is thus in relationship only with the weak leakage current of the transistor which is blocked.

Figure 2:
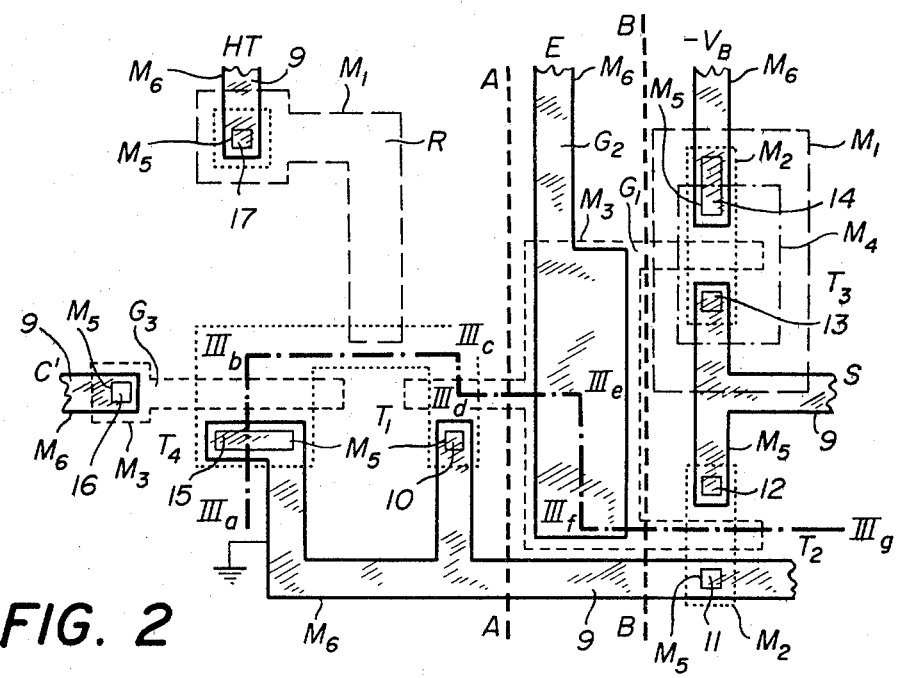
FIG. 2 is a top view of an integrated circuit layout corresponding to the equivalent electrical circuit of FIG. 1.

A manner according to which the various parts of the memory device corresponding to the equivalent circuit of FIG. 1 may be arranged is illustrated in FIG. 2. Actually, FIG. 2 consists of the masking layout which may be used for the manufacture of the circuit.

This masking layout shows the outlines of six different masks $M_1$, $M_2$, $M_3$, $M_4$, $M_5$ and $M_6$ which are necessary for the manufacture of the circuit. The process of manufacture utilizes the well-known MOS technology, which is described, for instance, in Swiss Pat. No. 542,518 owned by the applicant. Accordingly, this process will not be described in detail in the present description. Moreover, this process is not the only one which allows the fabrication of these memory devices to be carried out. It will just be remembered that the manufacturing technology of a MOS integrated circuit comprises the following steps which are performed starting from a substrate consisting of a $n^-$-type monocrystalline silicon wafer.

The first mask, which is referred to as $M_1$ in FIG. 2, is used for defining the substrate areas in order to form the slightly doped $p^-$-type well in which the n-channel transistor $T_3$ is to be realized. Owing to the fact that it is slightly doped, such a well may also be utilized to implement a resistance R having a value of some kiloohms per square.

The second mask, referred to as $M_2$ in FIG. 2, defines the windows encompassing the sources, drains and gates regions of the transistors $T_1$, $T_2$, $T_3$ and $T_4$ and the ohmic contact at the input of resistance R, said regions being defined in a field oxide layer, having a thickness of about 10,000 Å, which has been grown beforehand.

The third mask, referred to as $M_3$ in FIG. 2, is used to define the polycrystalline silicon floating gate $G_1$ of the transistors $T_1$, $T_2$ and $T_3$ and the polycrystalline silicon gate $G_3$ of the transistor $T_4$. These gates are placed above the gate oxide layer in the regions defined by $M_2$ and above the field oxide layer everywhere else.

Mask $M_4$ is used for defining the regions to be $n^+$ doped inside and $p^+$ doped outside in the course of the manufacturing process. In the manufacturing process which is described in Swiss Pat. No. 542,518, this mask is used for removing the boron-doped silicon oxide layer above the n-channel transistor before depositing a phosphorus-doped oxide layer, these two layers forming the diffusion sources of the regions to be $p^+$ and $n^+$ doped. In this case, the $p^+$ and $n^+$ diffusion steps are carried out simultaneously. The regions to be $n^+$ doped are covered by a single oxide layer which is phosphorus-doped, whereas the other regions are covered by boron- and phosphorus-doped oxide layers.

The fifth mask, which is referred to as $M_5$ in FIG. 2, allows opening the contact windows 10, 11, 12, 13, 15, and 16 through the said doped oxide layers. No contact window is realized on gate $G_1$ which consequently leaves this gate floating. Window 14 overlaps the edge of mask $M_4$ and allows electrical contacting of the source of the n-channel transistor $T_3$ to the $p^-$-type well defined by $M_1$.

The sixth and last mask $M_6$ defines the metallic interconnection pattern by etching of this pattern in an aluminum layer which has been deposited beforehand. In this embodiment, the aluminum layer is used to form the second gate $G_2$ which is coupled by capacitance with the floating gate $G_1$ above the field oxide layer which has a thickness of 10,000 Å.

Figure 3:
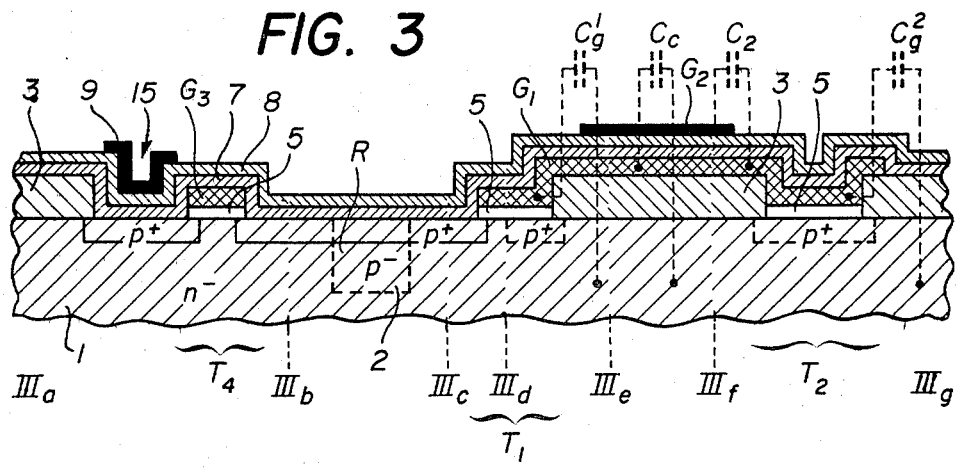
FIG. 3 is a schematic cross-sectional view, taken through broken section plane IIIa–IIIg of the integrated circuit of FIG. 2.

A cross-section $III_a$–$III_g$ of the memory device of FIG. 2 is illustrated in FIG. 3, showing schematically the arrangement of the different important parts of this device, such as the control transistor $T_4$, the injection transistor $T_1$ and the readout transistor $T_2$. The p-type drain regions of $T_1$ and $T_2$ which are not located in the cross-sectional plane $III_a$–$III_g$, are illustrated as dotted lines in FIG. 3. The resistance R has also been illustrated whereas the well in which is located the n-channel MOST has not been indicated in order to provide clearer visualization.

This cross-section $III_a$–$III_g$, illustrated in FIG. 3, shows the arrangement of the $n^-$-type doped monocrystalline silicon substrate 1, the $p^-$-type doped well 2, the field oxide layer 3 and the gate oxide layer 5 of the transistors $T_1$ and $T_2$, the polycrystalline silicon floating gate $G_1$, the second gate $G_2$, the gate $G_3$ of transistor T4, the boron-doped silicon oxide layer 7, the phosphorus-doped silicon oxide layer 8 and aluminum metallization layer which forms the electrical connections.

In FIG. 3, the capacitances which are acting during the erasure operation are illustrated with lines formed by dashes. Capacitance $C_2$ is the capacitance between the floating gate $G_1$ and the second gate $G_2$; capacitance $C_c$ is the capacitance between the floating gate $G_1$ and the substrate or the well, across the field oxide layer; the capacitance $C_{gate}$ being the capacitance between the floating gate and the substrate or the well, across the gate oxide layer ($C_{gate} = C^1_g + C^2_g + C^3_g$, wherein the reference numbers 1, 2 and 3 are relative to the transistors $T_1$, $T_2$ and $T_3$, respectively). It may easily be shown that the condition with respect to the electric fields, i.e. the fact that the field across the gate oxide layer should be higher than the field between the floating gate and the second gate, is equivalent to the following relationship concerning the areas:

$$S_2 > S_{gate} + S_{field} \frac{d_{gate}}{d_{field}}$$

Wherein $S_2$ is the surface portion of the second electrode facing the floating gate $G_1$; $S_{gate}$ is the surface portion of the gate oxide layer and $S_{field}$ is the surface portion of the field oxide layer which are both located under the floating gate electrode; and, finally, $d_{gate}$ and $d_{field}$ are the respective thicknesses of these oxide layers. The higher the ratio of $C_2$ to the sum $C_{gate} + C_{field}$ becomes, the better the capacitive coupling between the second gate and the floating gate will be.

Figure 4:
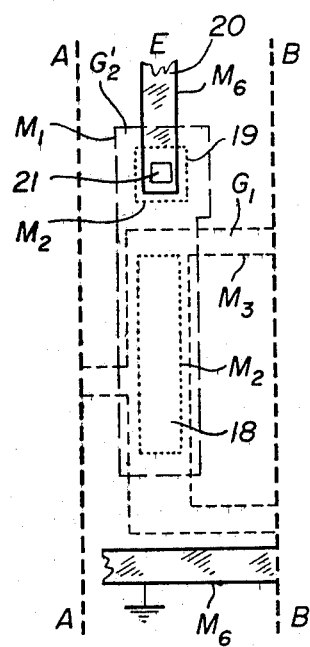
FIG. 4 is a top view illustrating another layout of the coupling capacitance between terminal E and the floating gate (part AB of FIG. 2).

The integrated circuit of FIG. 4 illustrates an alternate embodiment of the erasing part A-B wherein the second gate $G_2$ is not realized as an aluminum metallization layer but as a well $G'_2$. The floating gate $G_1$ is deposited on a gate oxide layer, above the well $G'_2$, in the window 18 which is opened simultaneously with the window 19 using the second mask. This last window is p+-doped and allows an ohmic connection to the p−-doped well $G'_2$, to be made, the aluminum electrical connection 20 is contacting this p+-p junction in the window 21 which is realized using the fifth mask.

Since the thickness of the insulating layer between the second gate and the floating gate is reduced by a factor from 3 to 5 in comparison with the embodiment comprising an aluminum gate, a considerable saving of surface area is achieved in the embodiment of FIG. 4 with respect to the embodiment of FIG. 3.

By way of a further alternate embodiment, aimed at improving the capacitance coupling between the erasing gate $G'_2$ and the floating gate $G_1$, the aluminum layer 20 which is used as an electrical lead between the well $G'_2$ and terminal E, could be extended above gate $G_1$.

The second gate, consisting of a p−-type well, suffers from the disadvantage of forming a parasitic transistor between the p− well and each grounded source, the floating gate acting as the gate of the parasitic transistor.

Whereas two embodiments of the memory device according to the invention have been described above, further embodiments of said device are possible.

According to an alternate embodiment of the resistance element R, a p-channel transistor is provided the gate of which is connected to the drain and to the terminal HT, its source being connected to the drains of the transistors $T_1$ and $T_4$.

Figure 5:
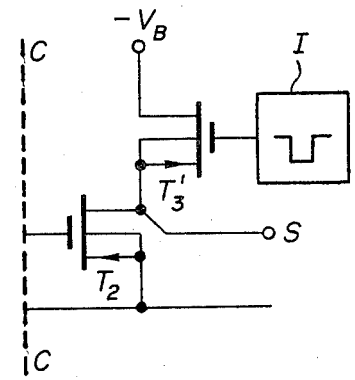
FIG. 5 is a schematic view of the output inverter of the equivalent electrical circuit of FIG. 1, according to one particular embodiment thereof.

According to an alternate embodiment, which is illustrated in FIG. 5, of the output inverter (part on the right side of line C of FIG. 1), the n-channel transistor is substituted by a pulsed load. This pulsed load consists of a p-channel transistor $T'_3$ the source of which is connected to the drain of the p-channel transistor $T_2$ and to an output terminal S, its drain being connected to a negative supply terminal $-V_B$ and its gate being connected to a generator of negative pulses I which renders the transistor conductive only during a reading phase. Thus a memory device is obtained which may be entirely realized utilizing a p-channel technology. With this type of inverter, read-out operation can no longer be permanent and without energy consumption.

The above-described may be used in many different fields of electronics. However, owing to its dimensions, it is preferably used in the cases where a memory having a low capacity but a very long information retention time is required and where memory erasure is only occasionally carried out. This device may be very useful in the those applications where low voltage and low energy consumption addressing and read-out are required such as in the case of small dimensions apparatus provided with a storage battery.

We claim:

1. An electrically reprogrammable non-volatile memory device comprising an integrated circuit including complementary MOS transistors provided with a polycrystalline silicon floating gate electrode, in a common n−-type substrate which forms the grounded electrode, wherein said circuit is composed of three parts:
   the first part being utilized to perform writing of information and addressing;
   the second part being utilized to perform erasure; and the third part being utilized to perform read-out of the information;
   said floating gate electode forming a common electrode to said three parts of the device;
   said first part comprising a p-channel writing transistor, having its drain, which provides a p+-n junction for injection of electrons, connected, on the hand, to the drain of a p-channel control transistor the source of which is grounded, and, on the other hand, to a resistance element which is connected to a terminal delivering a high negative voltage during the writing operation;
   said second part of the circuit comprising a second gate electrode which is capacitively coupled to said floating gate electrode in such a manner that the electric field between both electrodes is lower than the electric field across the gate oxide layer of the said transistors, and said second gate electrode being connected to a terminal delivering a high negative voltage during the erasure operation; and
   said third part of the circuit consisting of a p-channel read-out transistor, the source of which is grounded, its gate forming a portion of the floating gate electrode and its drain being connected to a read-out terminal and to a terminal of a loading element having its other terminal connected to a negative supply voltage.

2. The device defined in claim 1, wherein said writing transistor includes a grounded source.

3. The device defined in claim 1, wherein said resistance element consists of a p−-type diffusion well formed in the common n−-type doped substrate.

4. The device defined in claim 1, wherein said resistance element consists of a p-channel transistor the gate and drain of which are connected to the terminal which delivers a high negative potential during the writing phase and the source of which is connected to the drains of the writing transistor and of the control transistor.

5. The device defined in claim 1, wherein the surface portion $S_2$ of the said second electrode $G_2$ which faces said floating gate electrode $G_1$, the surface portion $S_{gate}$ of the gate oxide layer and the surface portion $S_{field}$ of the field oxide layer located under the floating gate electrode and the respective thicknesses $d_{gate}$ and $d_{field}$ of said gate oxide layer and of said field oxide layer (FIG. 3) are related by the relationship:

$$S_2 > S_{gate} + S_{field} \cdot \frac{d_{gate}}{d_{field}}$$

6. The device defined in claim 1, wherein said second electrode is formed by a portion of a metallic layer which ensures metallic interconnections between the circuit parts and its terminals.

7. The device defined in claim 1, wherein said second electrode consists of a well which is separated from the floating gate electrode by a gate oxide layer.

8. The device defined in claim 1, wherein said loading element consists of a n-channel transistor the source of which is connected to said terminal connected to a negative supply potential, the gate of which is formed by a portion of the floating gate electrode and the drain of which is connected to the read-out terminal and to the drain of the read-out transistor.

9. The device defined in claim 1, wherein said loading element consists of a p-channel transistor the source of which is connected to the drain of the read-out transistor, the drain of which is connected to said terminal connected to a negative supply potential and the gate of which is connected to a pulse generator which renders said transistor conductive only during a read-out phase.

* * * * *